United States Patent
Sun et al.

(10) Patent No.: US 9,436,078 B2
(45) Date of Patent: Sep. 6, 2016

(54) METHOD FOR A LOW PROFILE ETCHABLE EUV ABSORBER LAYER WITH EMBEDDED PARTICLES IN A PHOTOLITHOGRAPHY MASK

(71) Applicant: GLOBALFOUNDRIES Inc., Grand Cayman (KY)

(72) Inventors: Lei Sun, Albany, NY (US); Obert Reeves Wood, II, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 68 days.

(21) Appl. No.: 14/609,588

(22) Filed: Jan. 30, 2015

(65) Prior Publication Data
US 2016/0223896 A1    Aug. 4, 2016

(51) Int. Cl.
*G03F 1/24* (2012.01)
*G03F 1/22* (2012.01)

(52) U.S. Cl.
CPC ..................................... *G03F 1/22* (2013.01)

(58) Field of Classification Search
CPC .................................. G03F 1/24; G03F 1/22
USPC ............................................................ 430/5
See application file for complete search history.

(56) References Cited

U.S. PATENT DOCUMENTS

| 2003/0013216 A1* | 1/2003 | Rau | B82Y 10/00 430/5 |
| 2007/0218410 A1* | 9/2007 | Yen | G03F 7/091 430/313 |

OTHER PUBLICATIONS

Pret et al., "Impact of mask line roughness in EUV lithography", Extreme Ultraviolet (EUV) Lithography II, Proceedings of SPIE vol. 7969, 2011, 7 pages.
Rastegar et al., "Study of Alternative Capping and Absorber Layers for Extreme Ultraviolet (EUV) Masks for sub-16 nm Half-Pitch Nodes", Extreme Ultraviolet (EUV) Lithography V, Proceedings of SPIE vol. 9048, 2014, 11 pages.

* cited by examiner

*Primary Examiner* — Stephen Rosasco
(74) *Attorney, Agent, or Firm* — Ditthavong & Steiner, P.C.

(57) ABSTRACT

Methods for creating a EUV photolithography mask with a thinner highly EUV absorbing absorber layer and the resulting device are disclosed. Embodiments include forming a multilayer reflector (MLR); forming first and second layers of a first EUV absorbing material over the MLR, the second layer being between the first layer and the MLR; and implanting the first layer with particles of a second EUV absorbing material, wherein the first EUV absorbing material is etchable and has a lower EUV absorption coefficient than the second EUV absorbing material, and wherein the implanted particles are substantially separated from each other.

20 Claims, 5 Drawing Sheets

BACKGROUND

BACKGROUND

METHOD FOR A LOW PROFILE ETCHABLE EUV ABSORBER LAYER WITH EMBEDDED PARTICLES IN A PHOTOLITHOGRAPHY MASK

TECHNICAL FIELD

The present disclosure relates generally to designing and fabricating integrated circuit (IC) devices. The present disclosure is applicable to design and fabrication processes associated with extreme ultra violet (EUV) photomasks utilized in photolithographic patterning at 10 nanometer (nm), 7 nm, 5 nm nodes and beyond.

BACKGROUND

Generally, in fabrication of an IC device, a photolithography (lithography) process may be utilized to print/pattern various layers of a circuit design onto a surface of a silicon (Si) substrate for creating various devices (e.g., transistors) and circuits to form the IC device. In lithography, a photomask is used to mask or expose areas on the substrate that are to be blocked from or patterned by, respectively, a light source (e.g., EUV). With miniaturization of the IC devices, EUV lithography (e.g., with 13.5 nm wavelength photons) is utilized to achieve a better resolution when compared to other lithography options (e.g., 193 nm immersion lithography, multiple patterning, etc.). Optical elements in an EUV scanner must be reflective, which require that the EUV photomask be illuminated at an angle to its normal (non-orthogonal). However, non-orthogonal illumination of the EUV photomask can cause, for example, a shadowing of lines that are perpendicular to the incident beam, the appearance of telecentricity errors that can result in a pattern shift through focus, and image contrast loss due to apodization by a reflective mask coating.

FIG. 1A is a cross sectional diagram of an EUV photomask. Diagram 100 illustrates a portion of an example EUV photomask including a multilayer reflector (MLR) stack 101 of alternate layers of molybdenum and silicon material, a ruthenium (Ru) capping layer 103, layer 105 including EUV absorber material, and antireflective coating (ARC) layer 107. An EUV beam 109 is at angle 111 of six degrees (6°) that causes reflective beams 113 to reflect from effective reflection plane 115. However, the off-axis illumination of the EUV beam 109 can cause a shadowing effect due to the thickness of the layers 105 and 107. For example, there can be a shadowing at the capping layer 103 as the EUV beam 109 passes by the ARC layer 107 at contact point 117. A lower profile of the combined thickness of the layers 105 and 107 could provide for less interference with illumination of the EUV beam 109 onto the upper surface of the Ru cap 103 and the reflective reflection plane 115. Even in a scenario where there is no ARC layer, the contact point 117 may be at the upper surface of the absorber layer 105. However, as in diagram 150 of FIG. 1B, in order to maintain the EUV reflectance 151 at or below 2%, the thickness 153 of a typical tantalum (Ta) based absorber layer is about 50 nm to 60 nm. Tantalum nitride (TaN) or tantalum boron nitride (TaBN) are the industry standard for EUV photomask absorber layers for their etch compatibility even though Ta-based materials have only a moderate EUV absorption coefficient. Although other materials such as nickel, cobalt, sliver, etc. with high EUV absorption coefficients may be used to achieve a thinner absorbing layer 105, such materials cannot be etched away during the fabrication process of an IC device without affecting/damaging adjacent layers, e.g., the MLR stack 101.

A need therefore exists for a methodology enabling creation of an EUV photomask with an etchable and highly absorbing thinner absorber layer and the resulting photomask.

SUMMARY

An aspect of the present disclosure is an EUV photomask with an etchable and highly absorbing thinner absorber layer.

Another aspect of the present disclosure is a method for creating an EUV photomask with an etchable and highly absorbing thinner absorber layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a MLR; forming first and second layers of a first EUV absorbing material over the MLR, the second layer being between the first layer and the MLR; and implanting the first layer with particles of a second EUV absorbing material, wherein the first EUV absorbing material is etchable and has a lower EUV absorption coefficient than the second EUV absorbing material, and wherein the implanted particles are substantially separated from each other.

Another aspect includes implanting the particles to a total weight of 50% to 90% of a total weight of the first layer, and wherein the first EUV absorbing material includes a Ta-based material.

Further aspects include forming the Ta based first and second layers by sputtering in an inert gas atmosphere.

In one aspect, the particles include nickel (Ni), cobalt (Co), silver (Ag), indium (In), tellurium (Te), or platinum (Pt) nanoparticles.

Further aspects include forming the first layer to a thickness of 20 nm to 40 nm, and forming the nanoparticles to a size less than 5 nm.

In a further aspect, the first EUV absorbing material includes TaN or TaBN.

In one aspect, the MLR coating includes a stack of alternate layers of molybdenum and silicon material.

Another aspect includes forming a Ru capping layer between an upper surface of the MLR coating and a lower surface of the second layer.

A further aspect includes forming the second layer to a thickness of 2 nm to 3 nm and of a Ta-based material.

Another aspect of the present disclosure includes a photolithography mask (photomask) that includes a Ru capped multilayer reflector MLR; first and second layers of a first EUV absorbing material over the Ru capped MLR, the second layer being between the first layer and the Ru cap; and particles of a second EUV absorbing material implanted into the first layer, wherein the first EUV absorbing material is etchable and has a lower EUV absorption coefficient than the second EUV absorbing material, and wherein the implanted particles are substantially separated from each other.

In one aspect of the photolithography mask, a total weight of the particles is 50% to 90% of a total weight of the first layer, and wherein the first EUV absorbing material comprises a Ta based material.

In another aspect of the photolithography mask, the first EUV absorbing material includes TaN or TaBN.

In a further aspect of the photolithography mask, the particles include Ni, Co, Ag, In, Te, or Pt nanoparticles.

In some aspects of the photolithography mask, the first layer is formed to a thickness of 20 nm to 40 nm, and the nanoparticles are less than 5 nm.

In one aspect of the photolithography mask, the MLR includes a stack of alternating layers of molybdenum and silicon material.

In another aspect of the photolithography mask, the second layer is formed to a thickness of 2 nm to 5 nm and comprises a Ta-based material.

Another aspect of the present disclosure includes a method including: forming a Ru-capped MLR; forming first and second layers of a Ta based material over the MLR, the second layer being between the first layer and the Ru cap; and implanting the first layer with Ni, Co, Ag, In, Te, or Pt nanoparticles, wherein the implanted Ni nanoparticles are substantially separated from each other and have a higher EUV absorption coefficient than the Ta-based material in the first layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of shadowing of lines, telecentricity errors, and contrast loss attendant upon using an EUV photomask with a TaN or TaBN absorber or an inability to etch attendant upon using an EUV photomask with a Ni absorber. The present disclosure addresses and solves such problems, for instance, by, inter alia, designing and fabricating an EUV photomask with an etchable and highly absorbing thinner absorber layer formed of TaN or TaBN with particles of a highly absorbing material implanted therein.

Figure 1A:
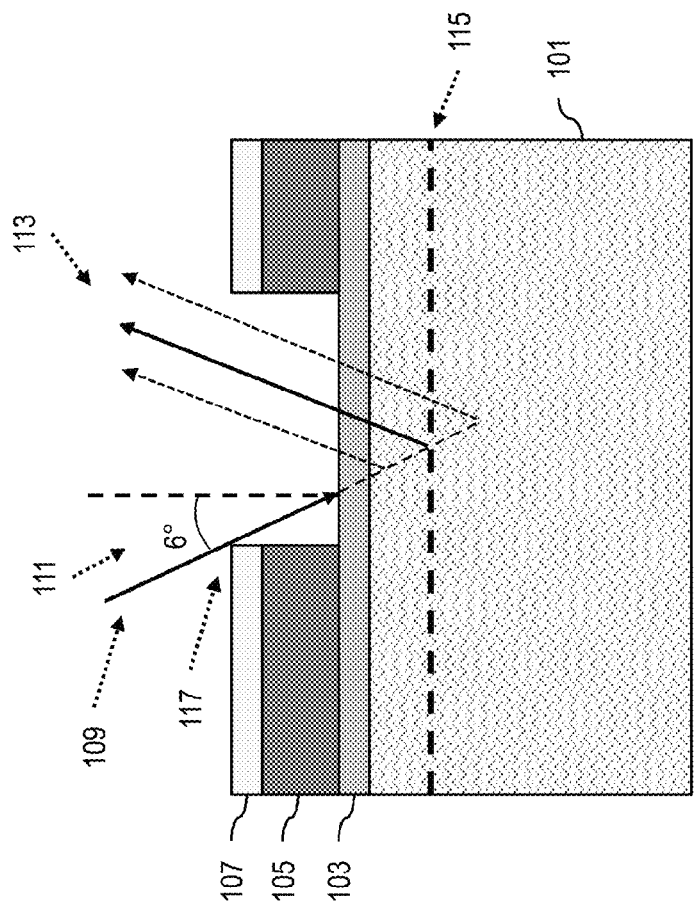
FIG. 1A is a cross sectional diagram of an EUV photomask.
Figure 1B:
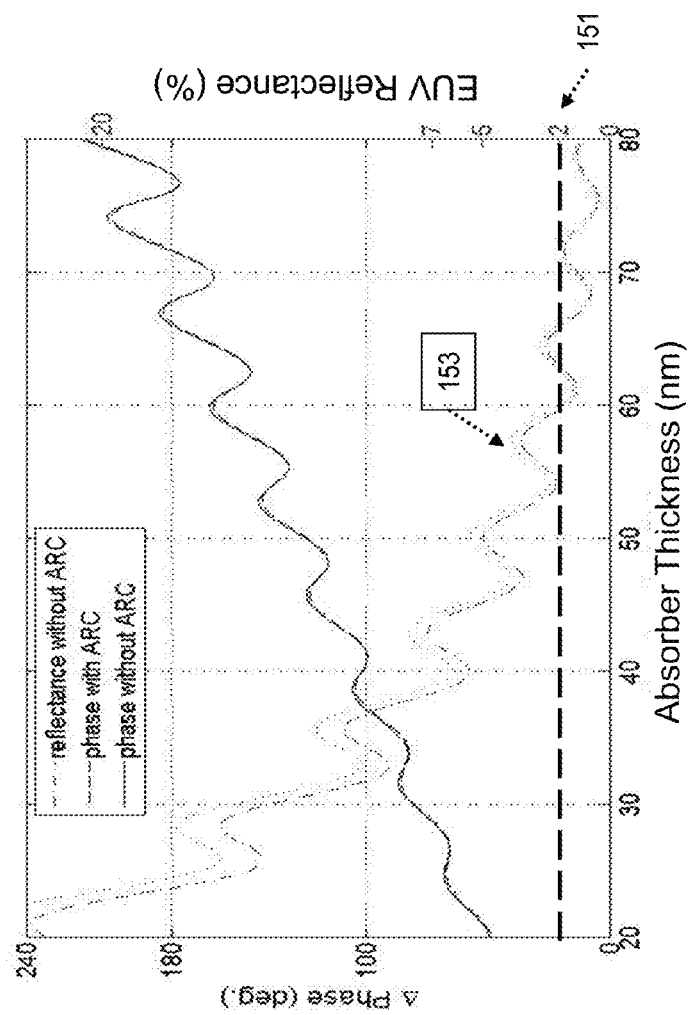
FIG. 1B illustrates a diagram of reflectance, phase shift, and absorber thickness of an example EUV photomask.
Figure 2A:
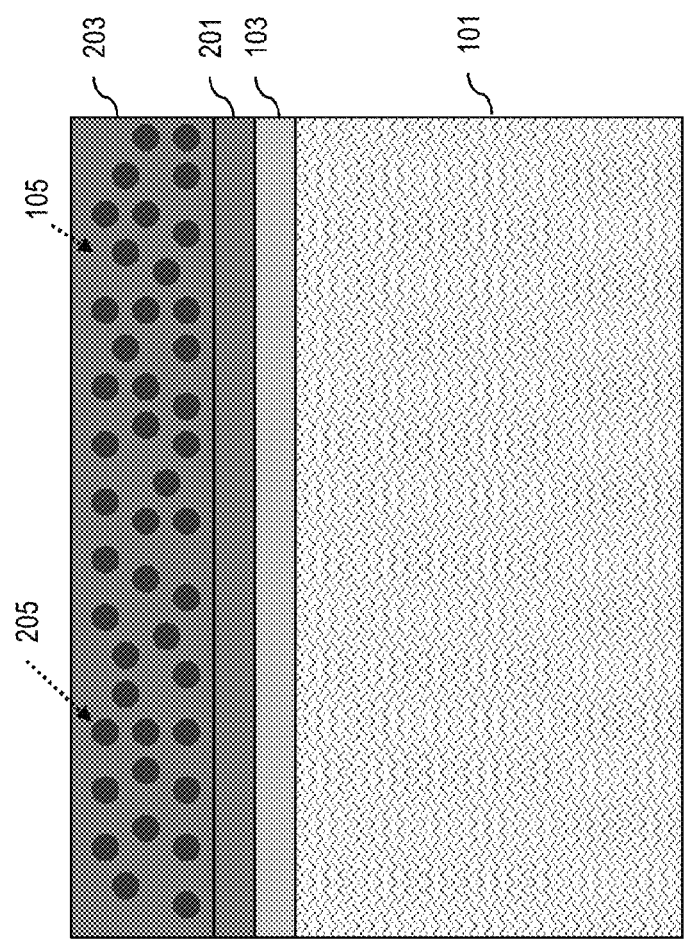
FIG. 2A illustrates a partial cross sectional diagram of an EUV photomask, in accordance with an exemplary embodiment.
Figure 2B:
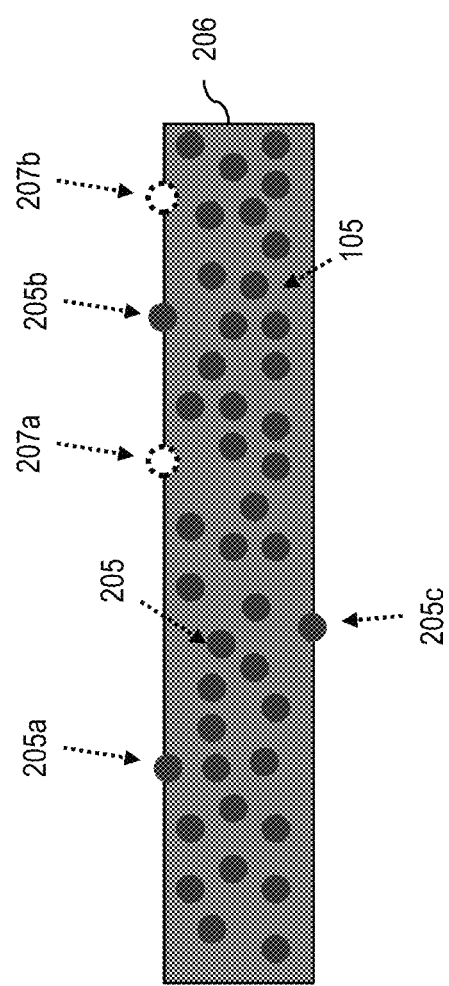
FIG. 2B illustrates a partial top down diagram of the EUV photomask, in accordance with an exemplary embodiment.

FIG. 2A—illustrates a partial cross sectional diagram of an EUV photomask, in accordance with an exemplary embodiment. FIG. 2B illustrates a partial top down diagram of the EUV photomask, in accordance with an exemplary embodiment.

FIG. 2A illustrates a partial cross section 200 of an EUV photomask that includes the MLR stack 101 and the Ru capping layer 103. Further, a Ta-based EUV absorber layer 201 is formed on an upper surface of the Ru capping layer 103. The absorber layer 201 may have a thickness of about 2 nm to 5 nm. Next, a Ta-based layer 203 is formed on an upper surface of the Ta-based layer 201 where the layer 203 includes the Ta-based material 105, which is additionally implanted with nanoparticles 205 of a second EUV absorbing material such as Ni, Co, Ag, In, Te, Pt, or the like materials that have higher EUV absorption coefficients than the Ta-based material 105. The EUV absorbing material 105 in the absorber layer 203 may, for example, include TaN or TaBN material. Further, the implanted nanoparticles 205 may have a total weight of 50% to 90% of a total weight of the layer 203, wherein the layer 203 has a thickness of 20 nm to 40 nm. Moreover, the nanoparticles 205 are substantially separated from each other within the absorber layer 203 and each particle 205 has a size less than 5 nm. The implanted nanoparticles 205 have a higher EUV absorption coefficient than the Ta-based material 105 such that the nanoparticles 205 absorb most of an EUV beam illuminated at the absorber layer 203. Moreover, the Ta-based material 105 combined with the implanted nanoparticles 205 can be etched by use of typical etching processes used for etching Ta-based material in fabrication of IC devices.

Figure 2C:
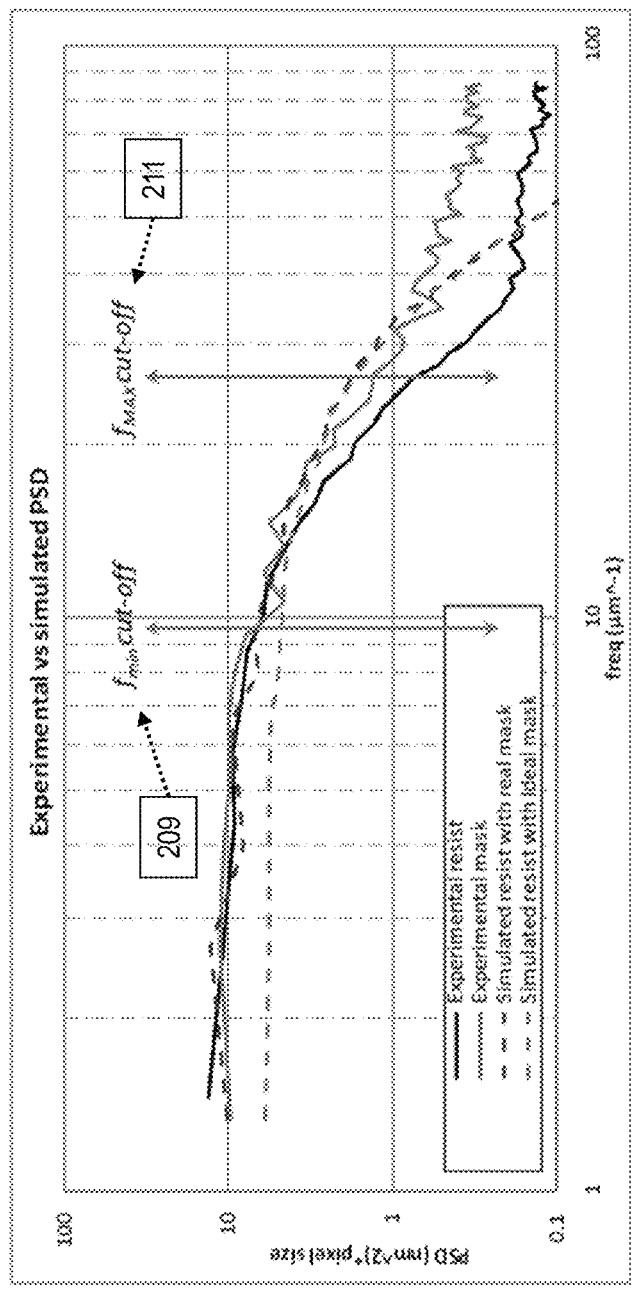
FIG. 2C illustrates a plot diagram of the roughness characteristics of a photomask, in accordance with another exemplary embodiment.

FIG. 2B illustrates the top down view of the edges of a feature in the absorber layer 203 following etch transfer. The Ta-based absorber material 105 is formed by sputtering in an inert gas atmosphere that usually includes admixtures of nitrogen and hydrogen to ensure that the absorber material 105 is amorphous and has a low surface roughness. Concurrently, Ni (or other highly EUV absorbing material) nanoparticles 205 may be deposited via a spray nozzle using a suitable carrier gas, wherein a relative deposition rate of the Ta-based material and the Ni nanoparticles is used to balance the weight percentage of the Ni nanoparticles in the absorber layer 203 against the etchability of the composite layer including the Ta-based material 105 and the Ni particles 205. Some of the nanoparticles 205 may result being located on the edges of a line, trench, or via. For example, nanoparticles 205a, 205b, and 205c are located on the edges of a feature 206 in the absorber layer 203 following etch transfer and, after etching, they may still stick to the edges of absorber pattern. Alternatively, some nanoparticles located on the edges may be washed away leaving voids such as 207a and 207b. Both scenarios, particles or voids on the edges, could result in an increase in line edge roughness (LER) on a photomask. However, as illustrated in FIG. 2C, studies have shown that the resulting high frequency mask LER will not be transferred to a wafer pattern. Diagram 250 shows the photomask and wafer substrate LER and power spectral density (PSD) comparison for 36 nm half pitch line and space printed with the EUV alpha demo tool (ADT) using conventional illumination. In low spatial frequency (f) region 209 ($f_{min}$cut-off), f<10 per micrometer ($\mu m^{-1}$), the photomask LER is transferred to wafer LER. In the mid frequency region, 10 $\mu m^{-1}$<f<20 $\mu m^{-1}$, a portion of the photomask LER is transferred to the wafer pattern LER. However, in a high frequency region, f>20 $\mu m^{-1}$, the photomask LER is not transferred to the wafer pattern. As noted, the size of the Ni nanoparticles may be 2 nm to 5 nm, or even smaller. For example, if the size of the Ni nanoparticles is 2 nm, then the corresponding frequency is at 500 $\mu m^{-1}$, and if the size is 5 nm, then the corresponding frequency is 200 $\mu m^{-1}$. In both examples, the frequencies are greater than $f_{max}$cut-off frequency 211, and, therefore, the Ni nanoparticle-induced photomask LER will not transfer to the wafer pattern.

The embodiments of the present disclosure can achieve several technical effects, including higher absorption for the absorber of an EUV photomask without sacrificing etchability and a reduction in shadowing of lines perpendicular to the incident beams, in pattern shifting through focus, and in image loss. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a multilayer reflector (MLR);
   forming first and second layers of a first extreme ultraviolet (EUV) absorbing material over the MLR, the second layer being between the first layer and the MLR; and
   implanting the first layer with particles of a second EUV absorbing material,
   wherein the first EUV absorbing material is etchable and has a lower EUV absorption coefficient than the second EUV absorbing material, and
   wherein the implanted particles are substantially separated from each other.

2. The method of claim 1, further comprising:
   implanting the particles to a total weight of 50% to 90% of a total weight of the first layer, and wherein the first EUV absorbing material comprises a tantalum (Ta) based material.

3. The method of claim 2, further comprising:
   forming the Ta based first and second layers by sputtering in an inert gas atmosphere.

4. The method of claim 1, wherein the particles comprise nickel (Ni), cobalt (Co), silver (Ag), indium (In), tellurium (Te), or platinum (Pt) nanoparticles.

5. The method of claim 4, further comprising:
   forming the first layer to a thickness of 20 nanometer (nm) to 40 nm, and forming the nanoparticles to a size less than 5 nm.

6. The method of claim 1, wherein the first EUV absorbing material comprises tantalum nitride (TaN) or tantalum boron nitride (TaBN).

7. The method of claim 1, wherein the MLR coating includes a stack of alternate layers of molybdenum and silicon material.

8. The method of claim 1, further comprising:
   forming a ruthenium capping layer between an upper surface of the MLR coating and a lower surface of the second layer.

9. The method of claim 1, further comprising:
   forming the second layer to a thickness of 2 nm to 5 nm and of a Ta-based material.

10. A photolithography mask comprising:
    a ruthenium (Ru) capped multilayer reflector (MLR);
    first and second layers of a first extreme ultraviolet (EUV) absorbing material over the Ru capped MLR, the second layer being between the first layer and the Ru cap; and
    particles of a second EUV absorbing material implanted into the first layer,
    wherein the first EUV absorbing material is etchable and has a lower EUV absorption coefficient than the second EUV absorbing material, and
    wherein the implanted particles are substantially separated from each other.

11. The photolithography mask of claim 10, wherein a total weight of the particles is 50% to 90% of a total weight of the first layer, and wherein the first EUV absorbing material comprises a tantalum (Ta) based material.

12. The photolithography mask of claim 11, wherein the first EUV absorbing material comprises tantalum nitride (TaN) or tantalum boron nitride (TaBN).

13. The photolithography mask of claim 10, wherein the particles comprise nickel (Ni), cobalt (Co), silver (Ag), indium (In), tellurium (Te), or platinum (Pt) nanoparticles.

14. The photolithography mask of claim 13, wherein the first layer is formed to a thickness of 20 nanometer (nm) to 40 nm, and the nanoparticles are less than 5 nm.

15. The photolithography mask of claim 10, wherein the MLR comprises a stack of alternating layers of molybdenum and silicon material.

16. The photolithography mask of claim 10, wherein the second layer is formed to a thickness of 2 nm to 5 nm and comprises a Ta-based material.

17. A method comprising:
    forming a ruthenium (Ru)-capped multilayer reflector (MLR);
    forming first and second layers of a tantalum (Ta) based material over the MLR, the second layer being between the first layer and the Ru cap; and implanting the first layer with nickel (Ni), cobalt (Co), silver (Ag), indium (In), tellurium (Te), or platinum (Pt) nanoparticles, wherein the implanted Ni nanoparticles are substantially separated from each other and have a higher extreme ultraviolet (EUV) absorption coefficient than the Ta-based material in the first layer.

18. The method of claim 17, implanting the nanoparticles to a total weight of 50% to 90% of a total weight of the first layer.

19. The method of claim 17, further comprising:
forming the first layer to a thickness of 20 nanometer (nm) to 40 nm and forming the nanoparticles to a size of 2 nm to 5 nm.

20. The method of claim 17, further comprising:
forming the second layer to a thickness of 2 nm to 5 nm.

* * * * *